United States Patent
Hall et al.

(10) Patent No.: US 7,783,936 B1
(45) Date of Patent: Aug. 24, 2010

(54) MEMORY ARBITRATION TECHNIQUE FOR TURBO DECODING

(75) Inventors: Eric K. Hall, Sandy, UT (US); Ayyoob Abbaszadeh, Salt Lake City, UT (US); Richard Ertel, Sandy, UT (US)

(73) Assignee: L-3 Communications, Corp., New York, NY (US)

( * ) Notice: Subject to any disclaimer, the term of this patent is extended or adjusted under 35 U.S.C. 154(b) by 1000 days.

(21) Appl. No.: 11/540,134

(22) Filed: Sep. 28, 2006

(51) Int. Cl.
*H03M 13/03* (2006.01)
*G11C 29/00* (2006.01)
*G06F 11/00* (2006.01)

(52) U.S. Cl. .................. 714/701; 714/702; 714/788

(58) Field of Classification Search .............. 714/701, 714/702, 788
See application file for complete search history.

(56) References Cited

U.S. PATENT DOCUMENTS

| | | | |
|---|---|---|---|
| 5,063,533 A * | 11/1991 | Erhart et al. | 711/157 |
| 5,968,200 A * | 10/1999 | Amrany | 714/786 |
| 6,381,728 B1 | 4/2002 | Kang | |
| 6,392,572 B1 | 5/2002 | Shiu et al. | |
| 6,606,725 B1 | 8/2003 | Wang et al. | |
| 6,678,843 B2 | 1/2004 | Giulietti et al. | |
| 7,289,569 B2 * | 10/2007 | Markman | 375/265 |
| 7,340,664 B2 * | 3/2008 | Shen | 714/755 |
| 7,640,479 B2 * | 12/2009 | Shen | 714/755 |
| 2002/0136332 A1 | 9/2002 | Dielissen et al. | |
| 2003/0028843 A1 | 2/2003 | Chang et al. | |
| 2004/0025103 A1 | 2/2004 | Obuchii et al. | |
| 2004/0052144 A1 | 3/2004 | Berens et al. | |
| 2004/0117716 A1 * | 6/2004 | Shen | 714/776 |
| 2006/0088119 A1 * | 4/2006 | Fu et al. | 375/265 |

OTHER PUBLICATIONS

Rostislav (Reuven) Dobkin, Michael Peleg, and Ran Ginosar, Parallel Interleaver Design and VLSI Architecture for Low-Latency MAP Turbo Decoders, IEEE Transactions on Very Large Scale Integration (VLSI) Systems, vol. 13, No. 4, Apr. 2005, pp. 427-438.*

Nimbalker, Ajit et al. "Contention-Free Interleavers": IEEE International Symposium on Information Theory, 2004, pp. 1-6, Chigcago, Illinois.

Dobkin, Reuven et al. "Parallel VLSI Architecture for MAP Turbo Decoder" IEEE International Symposium on Personal Indoor Mobile Radio Communication, 2002, pp. 1-11, Portugal.

Bauch, Gerhard et al. "A Comparison of Soft-In/SOft-Out Algorithms for Turbo-Detection" IEEE International Confernece on Telecommunications, 1998. pp. 259-263, Germany.

* cited by examiner

*Primary Examiner*—Joseph D Torres
(74) *Attorney, Agent, or Firm*—Kirton & McConkie; William T. Ralston

(57) ABSTRACT

A technique for resolving access contention in a parallel turbo decoder is described. The technique includes associating a plurality of buffer memories with the subdecoders so that accesses to banks of a shared interleaver memory can be rescheduled. Accesses can be rescheduled to prevent simultaneous accesses to a single bank of the shared interleaver memory based on an interleaver pattern.

9 Claims, 4 Drawing Sheets

```
Unpermuted   1   2   3   4   5   6   7   8   9  10  11  12  13  14  15  16
Permuted     6  16  12   2  15  13  11   5   8   1   3   4   9  10   7  14
            ——time——>
```

```
                                    Conflicts
                          ┌─────┬───┬───┬───┐
                          ↙     ↓   ↓   ↓
Subdecoder1    6(B1)  16(B2)  12(B2)  2(B1)  15(B2)  13(B2)  11(B2)  5(B1)
Subdecoder2    8(B1)   1(B1)   3(B1)  4(B1)   9(B2)  10(B2)   7(B1)  14(B2)

Time             1       2       3      4       5       6       7      8
```

FIG. 3

```
Subdecoder1    6   16  12   2   15  13   .    .   11   5
Subdecoder2    .    8   1   .    3   4   9   10    7  14

Time           1    2   3   4    5   6   7    8    9  10
```

FIG. 4

```
Subdecoder1    6   16  12   2    .    .  11   5   13  15
Subdecoder2    .    1   3   .    9   10   7  14    4   8

Time           1    2   3   4    5    6   7   8    9  10
```

FIG. 5

| Time | Buffer Memory Control | | Mux Control | | Shared Interleaver Memory | |
|---|---|---|---|---|---|---|
| | #1 | #2 | #1 | #2 | Bank #1 | Bank #2 |
| 1 | - | load | 1 | - | write | - |
| 2 | - | - | 2 | 1 | write | write |
| 3 | - | - | 2 | 1 | write | write |
| 4 | - | load | 1 | - | write | - |
| 5 | load | - | - | 2 | - | write |
| 6 | load | - | - | 2 | - | write |
| 7 | - | - | 2 | 1 | write | write |
| 8 | - | - | 1 | 2 | write | write |
| 9 | - | - | 2 | 1 | write | write |
| 10 | - | - | 2 | 1 | write | write |

MEMORY ARBITRATION TECHNIQUE FOR TURBO DECODING

FIELD OF THE INVENTION

The present invention relates generally to turbo decoding and more particularly to resolving access contention to a shared interleaver memory in a parallel turbo decoder.

BACKGROUND

Turbo codes are a powerful technique for reducing the effects of errors in a noisy communication channel. A turbo encoder at a transmitter inserts redundancy into a communicated signal, and a turbo decoder at a receiver uses the redundancy to correct transmission errors. Turbo decoding is, however, computationally complex. In some communication systems, the computational complexity of the turbo decoder sets an upper limit on the data rate that can be communicated through the communication system. Hence, techniques to improve the speed of turbo decoders are highly desirable.

One approach to increasing the speed of a turbo decoder is to perform parallel decoding. In parallel decoding, a block of data to be decoded is broken into a number of sub-blocks, and a number of sub-decoders operate simultaneously, each decoder decoding a different sub-block of data. By using N sub-decoders to decode each block, the time required to decode a block can be reduced by approximately a factor of N.

Parallel decoding presents a number of difficult challenges. To appreciate the difficulties of parallel decoding, the general encoding and decoding process will first be discussed. Usually, data is turbo coded by using two component encoders and an interleaver. The component encoders convert input data into output data which has redundancy added (and thus, for a given number of k input bits, n encoded bits are produced, where, generally, n>k). For example, a component encoder may be a block or convolutional code. The data encoded by one component encoder is interleaved with respect to the data encoded by the other component encoder, as discussed further below. Interleaving consists of reordering the data in a predefined pattern known to both the transmitter and receiver.

Both parallel and serial turbo code configurations are known in the art. In a parallel configuration, the component encoders operate on the data simultaneously, with a first component encoder operating on the data in sequential order and a second component encoder operating on the data in interleaver order. The outputs of the first and second component encoders are then combined for transmission. In a serial configuration, a first "outer" component encoder operates on the data, the encoded data is interleaved, and a second "inner" component encoder operates on the interleaved encoded data. In either configuration, some of the encoded bits may be deleted (punctured) prior to transmission.

Decoding turbo encoded data is typically performed using an iterative process. Two decoders repeatedly decode the data, each decoder corresponding to one of the component encoders. After the first decoder performs its decoding, the data is deinterleaved and then passed to the second decoder which performs its decoding. The data is then interleaved and passed back to the first decoder and the process repeated. With each iteration, more transmission errors are typically corrected. The number of iterations required to achieve most of the potential error correction capacity of the code depends on the particular code used.

A turbo decoder can be implemented by using a single decoder engine, which reads and writes results into a memory for each iteration. This memory is sometimes called an interleaver memory, and may be implemented as a ping-pong memory, where previous results are read from one part while new results are written to the other part. The write and read addressing is usually different, corresponding to interleaved or de-interleaved data ordering. For example, data is read (written) in sequential order by sequentially incrementing the address into the interleaver memory. Data is read (written) in interleaved order by using permuted addresses. For example, interleaving can be performed by writing results into the memory at a series of discontinuous permuted addresses corresponding to the interleaver pattern. The data can then be read from interleaver memory using sequential addresses to result in interleaved data for the next decoding iteration. Similarly, deinterleaving can be performed by writing results into the memory at a second series of discontinuous depermuted addresses that have the effect of placing interleaved data back into sequential order, available for sequential addressing for the next decoding iteration. Interleaving and deinterleaving can also be performed during the read operations, using sequential, permuted, or depermuted addresses, in which case writes can be performed using sequential addresses.

Turning to parallel decoding, each sub-decoder accesses the interleaver memory to read/write data. Hence, the interleaver memory is shared among the sub-decoders; the interleaver memory can therefore present a bottleneck in the performance of a parallel decoder. One approach to reduce this bottleneck is to implement the shared interleaver memory as a multiport memory, allowing multiple reads or writes each clock cycle. Multiport memories tend to be more expensive and complex than single port memories.

Another approach to reduce this bottleneck is to break the interleaver memory into banks, one bank for each sub-block/subdecoder, where the sub-decoders can access their corresponding banks simultaneously. This approach is very appropriate for field programmable gate array (FPGA) based decoder designs, as FPGAs have on-chip memory organized into banks, often called block RAMs. This approach, however, can fail for some interleavers. For example, interleaving is typically implemented across the entire block of data, and thus when reading or writing in permuted or depermuted address order, it may be necessary for a sub-decoder to access a bank corresponding to a different sub-decoder. When two subdecoders attempt to access the same bank at the same time a conflict results.

One prior solution involves reorganizing the interleaver structure as a conflict free interleaver to ensure that contention into the same bank is avoided. Conflict free interleavers, however, result in regularities in the interleaving structure that can result in reduced coding gain and susceptibility to jamming. Conflict free interleavers can be defined for particular degrees of parallelism, but may not be conflict free for all potentially useful degrees of parallelism. Additionally, many communications systems must comply with predefined interleaver structures which are not conflict free.

SUMMARY OF THE INVENTION

It has been recognized that it would be advantageous to develop a technique for reducing contention in parallel turbo decoder.

One embodiment of the present invention is a method for resolving access contention in a turbo decoder. The turbo decoder can include a plurality of subdecoders and a shared interleaver memory. The method includes providing a plurality of buffer memories and associating a buffer memory with each subdecoder to enable time shifting of accesses to the shared interleaver memory. The method also includes rescheduling the accesses to the shared interleaver memory based on the interleaver pattern to prevent simultaneous accesses to a single bank of the shared interleaver memory.

Another embodiment of the present invention includes a memory arbitrator for a parallel turbo decoder.

BRIEF DESCRIPTION OF THE DRAWINGS

FIG. 3 is a table of the nominal address access order for two subdecoders accessing a shared interleaver memory in permuted order for the interleaver of FIG. 2;

FIG. 4 is a table of rescheduled writes using a first-in first-out buffer memory in accordance with an embodiment of the present invention;

FIG. 5 is a table of rescheduled writes using a last-in first-out buffer memory in accordance with an embodiment of the present invention;

DETAILED DESCRIPTION

Figures 1, 2:
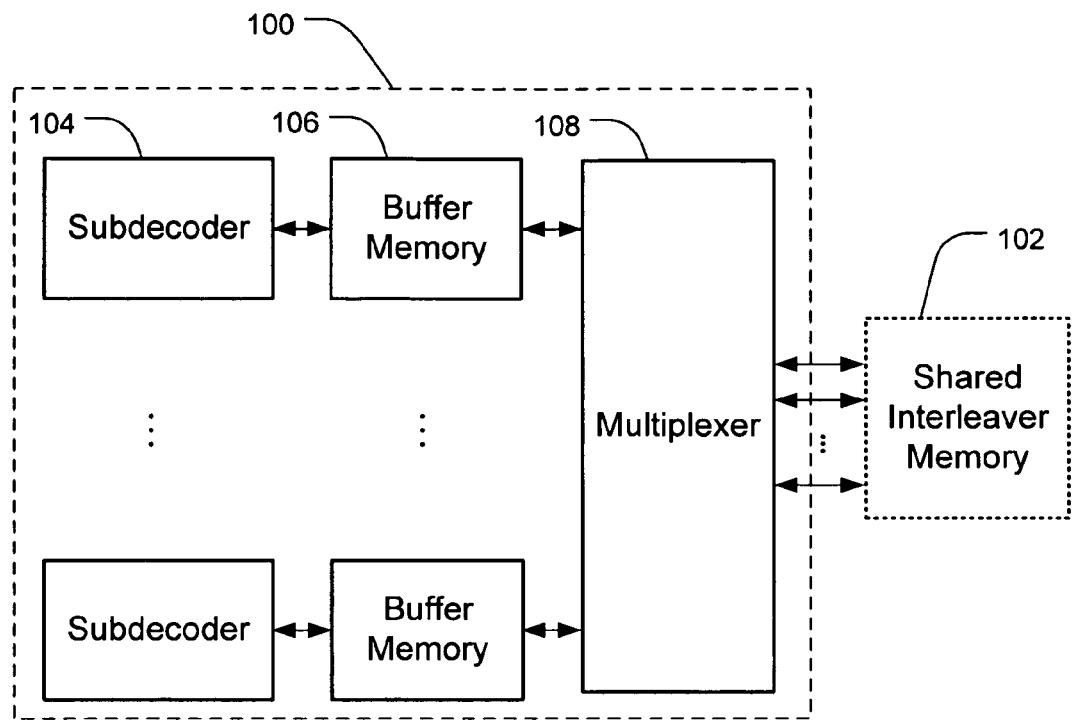
FIG. 1 is a block diagram of a memory arbitrator for a parallel turbo decoder in accordance with an embodiment of the present invention.
FIG. 2 is an illustration of an exemplary interleaver structure.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

FIG. 1 illustrates a block diagram of a memory arbitrator for a parallel turbo decoder in accordance with an embodiment of the present invention. The memory arbitrator, shown generally at 100, helps to resolve access contention to a shared interleaver memory 102 by a plurality of N subdecoders 104. The memory arbitrator includes a plurality of N buffer memories 106, where each buffer memory is associated with one of the plurality of subdecoders. Thus, there is one buffer memory per subdecoder. Each buffer memory can have a depth of M, thus providing the ability to buffer M access attempts to the shared interleaver memory. The buffer memories are coupled to a multiplexer 108 that allows rescheduled access to the shared interleaver memory by the plurality of buffer memories. Conflict can be avoided by rescheduling access (either reads, writes, or both) to the shared interleaver memory.

The shared interleaver memory 102 may be broken into a number of banks P. For example, P may be set equal to N, providing one bank for each subdecoder, although this is not essential. Each bank can be a single port memory, and thus a P bank shared interleaver memory can support P simultaneous accesses, provided that each access is to a different bank. The buffer memories 106 provide buffering which can be used to resolve access contention when two or more subdecoders attempt to write into the same bank of the shared interleaver memory.

For example, FIG. 2 illustrates a table representing an exemplary interleaver structure. The first row illustrates the sequential addressing order for non-interleaved data, and the second row illustrates the permuted addressing order for interleaved data. A parallel turbo decoder for the exemplary interleaver of FIG. 2 can be implemented using two subdecoders. For example, a first subdecoder can process the first half of the data block (first sub-block) and a second subdecoder can process the second half of the data block (second sub-block). Hence, a two bank shared interleaver memory for the exemplary interleaver of FIG. 2 can hold addresses 1 through 8 in the first bank and 9 through 16 in the second bank. When the subdecoders read or write in unpermuted order, no conflicts occur. For example, the first subdecoder can access the first bank to read or write addresses 1 through 8, and the second subdecoder can access the second bank to read or write addresses 9 through 16. When the subdecoders access the shared interleaver memory in permuted order, however, conflicts can occur. As illustrated by the table in FIG. 3, conflicts occur on the $1^{st}$, $4^{th}$, $5^{th}$, and $6^{th}$ access attempts where both subdecoders attempt to access the same bank simultaneously. (FIG. 3 shows the bank to which each addresses corresponds in parentheses).

Conflicting access attempts can be resolved by using the buffer memory to reschedule accesses as will now be explained. As a first example, contention resolution for write access is illustrated. For write access buffering, each buffer memory is configured to buffer write access to the shared interleaver memory by the associated subdecoder. In one exemplary embodiment, the buffer memory may be implemented by a first-in first-out (FIFO) memory. For cycles in which there is a conflict, the memory access is rescheduled to a later time, and the data held in the buffer memory. The table in FIG. 4 illustrates one example of rescheduled writes. The first conflict at time t=1 is avoided by rescheduling the write to $a_8$ to time t=2, and holding the data for $a_8$ in the buffer memory associated with the second subdecoder. Note that all later writes from the second subdecoder are also rescheduled to later in time, and the data is buffered in the FIFO buffer memory associated with the second subdecoder. At time t=4, another potential conflict is resolved by rescheduling the write to $a_3$ by the second subdecoder from the nominally required time of t=3 to the rescheduled time t=5. Again, all later writes are rescheduled to later in time, and additional data is buffered in the FIFO. Similarly, the writes to $a_{11}$ and $a_5$ by the first subdecoder are rescheduled from times t=7 and 8 to times t=9 and 10. Various other rescheduling arrangements are possible, as will occur to one of skill in the art in possession of this disclosure.

As can be seen, a buffer memory depth of 2 provides adequate buffering for this exemplary interleaver. The total number of clock cycles required to complete the writing into the shared interleaver memory is 10 cycles; 8 cycles corresponding to the length of the sub-blocks plus 2 additional cycles of overhead to resolve the access contention. In general, an interleaver of length L will use $L/N+L_0$ clock cycles to write the data into the shared interleaver memory, where $L_0$ is the additional overhead due to rescheduled accesses to avoid conflicts. For typical interleavers, $L_0$ is approximately 5 to 10% of L.

In accordance with another embodiment of the present invention, the buffer memory may include a last-in first-out (LIFO) memory as is known in the art. Operation in such a case is illustrated by the table in FIG. 5. Again, memory accesses are rescheduled to avoid contention. Here, the write accesses by the first subdecoder at nominally scheduled times t=5 and t=6 (writing addresses 15 and 13) are rescheduled by buffering data for addresses 15 and 13 in the buffer memory associated with the first subdecoder, and then writing data to addresses 15 and 13 at rescheduled times t=9 and t=10. Similarly, write accesses by the second subdecoder at nominally scheduled times t=1 and t=4 (to addresses 8 and 4) are rescheduled by buffering data in the buffer memory associated with the second subdecoder, and then writing the data to addresses 8 and 4 at rescheduled times t=9 and t=10. By giving preference to the first subdecoder for access the first bank (and preference to the second subdecoder for access to the second bank), the resulting rescheduled writes are non-conflicting (since the second subdecoder will buffer data to be written to the first bank and the first subdecoder will buffer data to be written to the second bank).

Figures 6, 7:
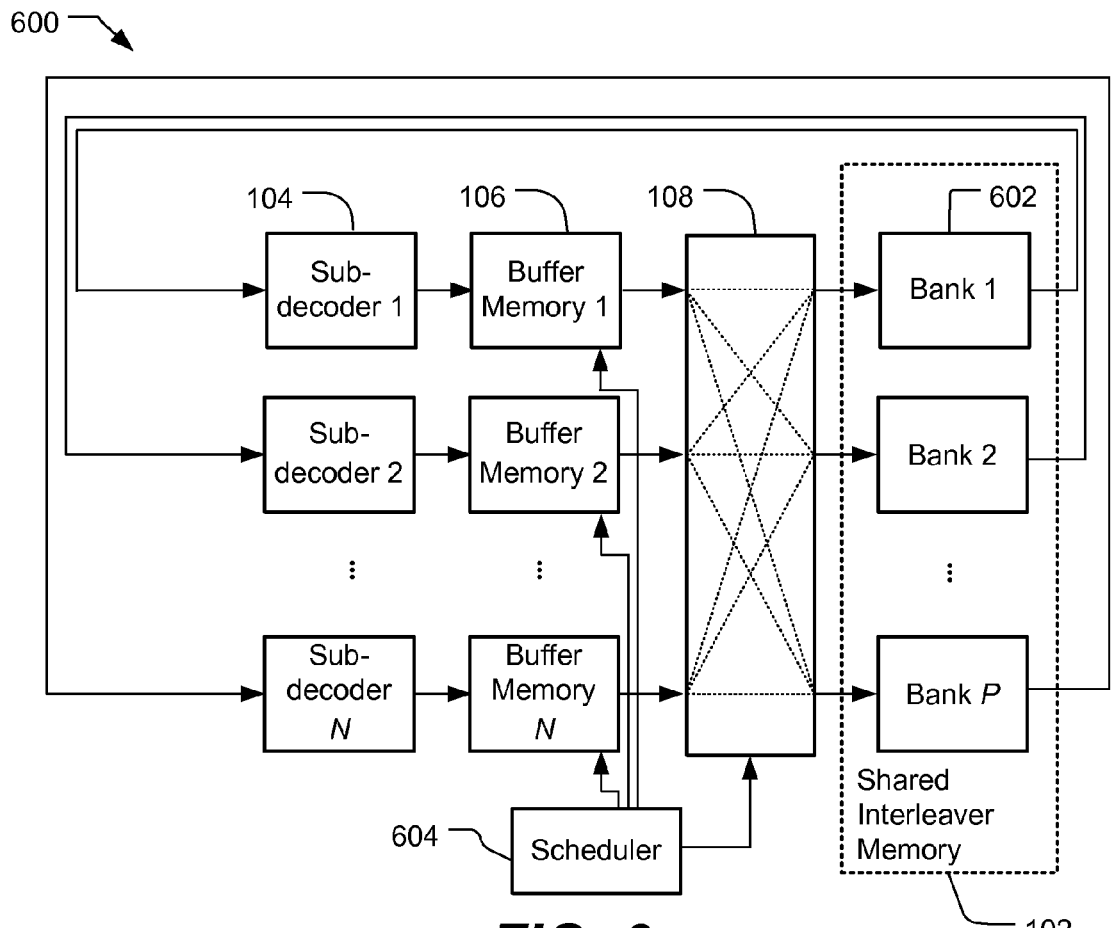
FIG. 6 is a block diagram of a write-side memory arbitrator in accordance with an embodiment of the present invention.
FIG. 7 is a table of an exemplary reschedule corresponding to the operation illustrated in FIG. 5.

A detailed implementation of a write-side memory arbitrator in accordance with an embodiment of the present invention is illustrated in FIG. 6. The write-side memory arbitrator, shown generally at 600, is compatible with the operation just illustrated in the tables of FIGS. 4-5. The write-side memory arbitrator includes plural means for buffering a plurality of memory access requests, for example a plurality of N buffer memories 106. The buffer memories are associated with the plurality of N subdecoders 104 in a one-to-one correspondence. The buffer memories can have a depth of M. Write access from each subdecoder is via the buffer memory, through a multiplexer 108, into the P banks 602 of the shared interleaver memory 102. The multiplexer is thus an N to P multiplexer. The write-side memory arbitrator includes a means for sequentially executing a plurality of buffered memory access requests at a plurality of rescheduled times, and a means for selecting the plurality of rescheduled times to avoid simultaneous access to a single bank of the shared interleaver memory. For example, write accesses can be controlled by a scheduler 604, which reschedules access to the shared interleaver memory by the plurality of buffer memories. For example, the scheduler can control the operation of the buffer memories and routing through the multiplexer. Write-access to the shared interleaver memory by a particular subdecoder can be delayed from a nominally required write time by holding the data in the buffer memory associated with that particular subdecoder and rescheduling the write to a later time, e.g., to remove an access contention with another subdecoder.

Referring to FIG. 6, one advantage provided by the memory arbitrator is straightforward interconnect of the buffer memories between the subdecoders and multiplexer. Because the buffer memories are placed on the sub-decoder side of the multiplexer, the buffer memories can be physically located near the subdecoders, resulting in the buffer memories being distributed throughout the physical layout of the decoder. The multiplexer is an N to P multiplexer, regardless of the depth M. This can help to minimize interconnect complexity, as discussed further below.

Another advantage of FIG. 6 is that the buffer memories can be less than N in depth, that is M<N. For typical pseudo-random interleavers using high degrees of parallelism N, relatively small amounts of buffering are required. In contrast, if the buffer memories were placed on the shared interleaver memory side of the multiplexer, a worst case scenario can occur where N subdecoders attempt to write to the same bank simultaneously, requiring each buffer memory to be capable of accepting and storing N simultaneous writes. Hence, associating each buffer memory with a sub-decoder helps to avoid this situation and reduce the overall amount of buffer memory required.

The table of FIG. 7 provides an exemplary reschedule corresponding to the operation illustrated by the table in FIG. 5 for a two-bank shared interleaver memory. The first column of the table in FIG. 7 shows a time index. The next two columns show load commands for a first and second buffer memory (associated with a first and second subdecoder, respectively). The next two columns show multiplexer control; Mux Control #1 specifies which shared interleaver memory bank the first buffer memory can access, and Mux Control #2 specifies which bank the second buffer memory can access. The last two columns show when writes are performed to each shared interleaver memory bank. At time t=1, the scheduler causes the second buffer memory (associated with the second subdecoder) to be loaded (buffering the data destined for address 8), the multiplexer is set so that the first buffer memory has access to the first bank, and a memory write is performed to the first bank. At time t=2 the scheduler causes the multiplexer to be set so that the first buffer memory has access to the second bank, the second buffer memory has access to the first bank, and memory writes are performed to both banks. The data output by the subdecoders is thus either written directly into the shared interleaver memory, or is held in the buffer memory and written into the shared interleaver memory at a later time. The reschedule for accesses to the shared interleaver memory may be pre-computed and stored in the scheduler, for example, in a read only memory. As a further detail example, a counter, counting from 1 to $L/N+L_0$, can be used to provide an address to a read only memory, the outputs of which are used to control the buffer memories, multiplexer, and write strobes to the banks of the shared interleaver memory.

Turning to the rescheduling strategy in more general terms, one exemplary technique is to use round robin scheduling, where subdecoders are provided access to each bank on a regular basis. For example, at t=1, the first subdecoder has access to the first bank, the second subdecoder has access to the second bank, etc. At time t=2, the first subdecoder has access to the second bank, the second subdecoder to the third bank, etc., and so on. Although this is a simple approach to implement, it can result in relatively inefficient operation.

For example, interleavers typically have somewhat random permutation patterns, and thus the banks to be written to tend to be somewhat random. A better rescheduling approach is to allow most of the accesses to occur at their nominal time, and reschedule just the few that have conflicts. Whenever two or more accesses conflict, there is a choice as to which access is allowed and which is rescheduled. This choice can affect later potential conflicts, as exemplified by the table in FIG. 4. Some choices may result in fewer conflicts later in time and some choices may result in more. Depending upon the complexity of the interleaver structure and the amount of parallelism a variety of rescheduling options may be available. Even simple interleavers, for example, FIG. 2, often have more than one possible rescheduling approach that can be selected. Some rescheduling approaches will result in less delay, and thus less buffer memory depth. For simple interleavers, optimal rescheduling strategies can be found manually. For a complex interleaver structure, a computer search can be performed to experimentally determine the optimum rescheduling. Hence, in accordance with another embodiment of the present invention, the scheduler may be configured to reschedule the access to the shared interleaver memory by each of the plurality of buffer memories so as to minimize the depth M.

Figure 8:
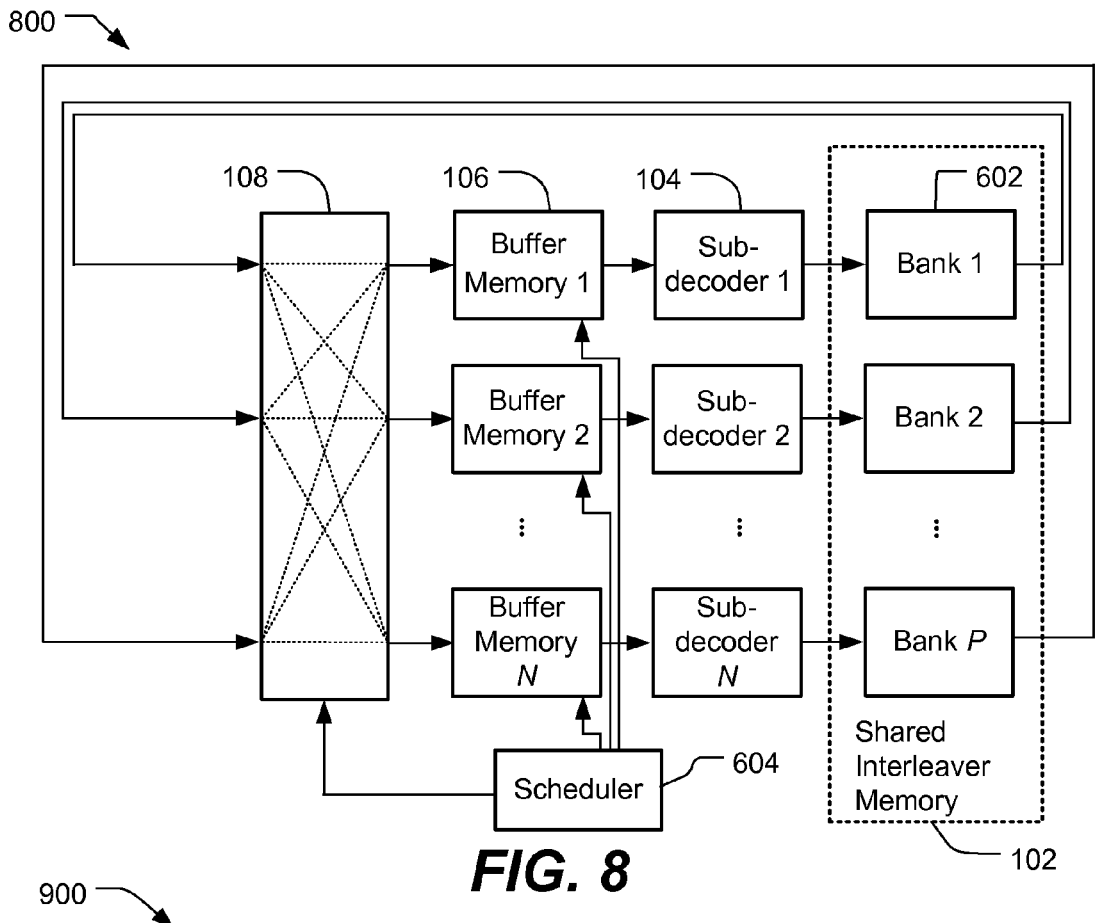
FIG. 8 is a block diagram of a read-side memory arbitrator in accordance with an embodiment of the present invention.

A detailed implementation of a read-side memory arbitrator in accordance with an embodiment of the present invention is illustrated in FIG. 8. The read-side memory arbitrator, shown generally at 800, includes plural means for buffering a plurality of memory requests. For example, the plural means for buffering can include a plurality of N buffer memories 106 associated with the plurality of N subdecoders 104 in a one-to-one correspondence. The buffer memories can have a depth of M. Read access from the shared interleaver memory banks 602 by the subdecoder is through a multiplexer 108 and via the buffer memories. The multiplexer is thus a P to N multiplexer, regardless of the depth M.

The read-side memory arbitrator can include means for sequentially executing a plurality of buffered memory access requests. For example, read accesses by the buffer memories can be controlled by a scheduler 604, which reschedules access to the shared interleaver memory by the plurality of buffer memories, for example by controlling the buffer memories and multiplexer. Read-access to the shared interleaver memory by a particular subdecoder can be advanced from a nominally required write time by reading the data in the buffer memory associated with that particular subdecoder before it is normally required, e.g., to remove an access contention with another subdecoder. Rescheduling of read access can be precomputed and stored in a read only memory. The scheduler can therefore include means for rescheduling the plurality of rescheduled times and means for selecting the plurality of rescheduled times as discussed above.

Figure 9:
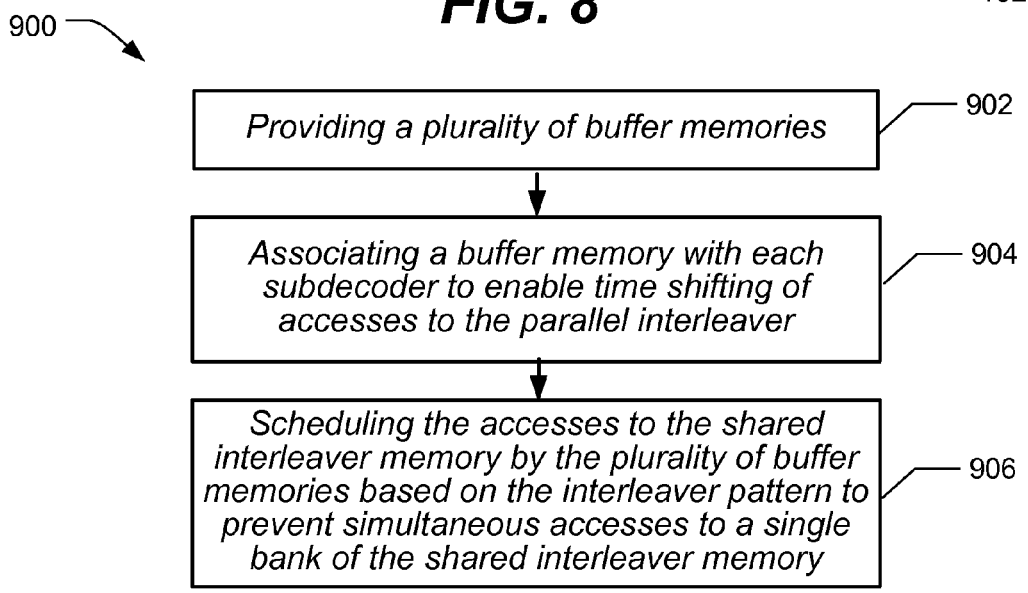
FIG. 9 is a flow chart of a method for resolving access contention to a shared interleaver by a plurality of subdecoders in a turbo decoder in accordance with an embodiment of the present invention.

Finally, the flowchart of FIG. 9 illustrates a method 900 for resolving access contention to a shared interleaver by a plurality of subdecoders in a turbo decoder, in accordance with an embodiment of the present invention. The method includes providing 902 a plurality of buffer memories. For example, the buffer memories may be provided by a hard or soft macro for use in a FPGA or application specific integrated circuit (ASIC). More particularly, the buffer memories may be defined by a hardware description language, such as Verilog, VHDL, or vendor proprietary format. The buffer memories may be first-in first-out memories, last-in first-out memories, or register files.

The method also includes associating 904 a buffer memory with each subdecoder to enable time shift of accesses to the shared interleaver memory. For example, a buffer memory macro may be included with the subdecoder macro in FPGA or ASIC definitions. Interconnect of the buffer memory to the subdecoder may be defined by the subdecoder macro or the buffer memory macro or separately. An ASIC or FPGA may be configured to physically place each buffer memory near the corresponding subdecoder, providing the advantage of simplifying interconnect between the buffer memories and subdecoders. For example, a macro can be defined where the parallelism N is a parameter. Because of the regularity of the structure provided by associating the buffer memories with the subdecoders, this macro can scale as N is changed. For example, a hard macro optimizing the placement and routing of the subdecoders and buffer memories can be used.

The method also includes rescheduling 906 the accesses to the shared interleaver memory by the plurality of buffer memories to prevent simultaneous accesses to a single bank of the interleaver memory. This rescheduling can be based on the interleaver as described above. For example, read access contention can be resolved by performing read access to the shared interleaver memory earlier than a nominally required time and buffering the read result in the buffer memory associated with the subdecoder. Alternately, write access contention can be resolved by performing write access to the shared interleaver memory later than a nominally required time by holding the write data in the buffer memory associated with the subdecoder until the later time the actual write is performed. Rescheduling may be pre-calculated, hardwired (e.g. using a read only memory as control), or dynamically determined (e.g. using a processor).

From the foregoing, and reiterating to some extent, it will be appreciated that several advantages are provided by the presently disclosed inventive techniques. The foregoing examples are necessarily limited in complexity in the interest of brevity. The principles described herein can be extended for parallel decoders using more than N=2 subdecoders. This extension will be apparent to one of skill in the art having possession of this disclosure. In general, a memory arbitrator structure in accordance with embodiments of the present invention uses relatively shallow depth buffer memories associated with each subdecoder to allow the rescheduling of accesses (read side or write side) to the shared memory. This helps to prevent access conflicts in the shared interleaver memory, enabling increased throughput in a parallel turbo decoder. The memory arbitrator structure is scalable with the degree of parallelism and provides straightforward interconnect between the subdecoders, buffer memories, multiplexer, and shared interleaver memory, making it amenable to macro definitions in an ASIC or FPGA library.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

What is claimed is:

1. A memory arbitrator for a parallel turbo decoder for resolving subdecoder access contention to a shared interleaver memory having multiple banks comprising:
   a plurality of N subdecoders configured for parallel sub-block decoding of a turbo code;
   a plurality of N buffer memories, each buffer memory associated with a different one of the plurality of subdecoders and having a depth M so as to buffer a plurality of M access attempts to the shared interleaver memory by the associated subdecoder;
   a multiplexer coupled between the plurality of N buffer memories and the shared interleaver memory and configured to enable access to the shared interleaver memory by the plurality of buffer memories; and
   a scheduler coupled to the plurality of subdecoders and configured to reschedule the accesses to the shared interleaver memory based on an interleaver pattern of the turbo decoder to avoid simultaneous access to at least one of the multiple banks of the shared interleaver memory.

2. The memory arbitrator of claim 1, wherein the scheduler is further configured to reschedule the accesses to the shared interleaver memory so as to minimize aggregate delay associated with access to the shared interleaver memory.

3. The memory arbitrator of claim 1, wherein the scheduler further comprises a read only memory configured to hold a predetermined reschedule of the accesses to the shared interleaver memory.

4. The memory arbitrator of claim 1, wherein M<N.

5. The memory arbitrator of claim 1, wherein the buffer memories are each configured to buffer read access to the shared interleaver memory by the associated subdecoder.

6. The memory arbitrator of claim 1, where the buffer memories are each configured to buffer write access to the shared interleaver memory by the associated subdecoder.

7. The memory arbitrator of claim 1, wherein each of the buffer memories is a first-in first-out memory.

8. The memory arbitrator of claim 1, wherein each of the buffer memories is a last-in first-out memory.

9. A memory arbitrator for a parallel turbo decoder for resolving subdecoder access contention to a shared interleaver memory having multiple banks comprising:

a plurality of N subdecoders configured for parallel sub-block decoding of a turbo code;

a plurality of N buffer memories, each buffer memory associated with a different one of the plurality of subdecoders and having a depth M so as to buffer a plurality of M access attempts to the shared interleaver memory by the associated subdecoder, wherein each buffer memory is a last-in first-out memory; and a multiplexer coupled between the plurality of N buffer memories and the shared interleaver memory and configured to enable access to the shared interleaver memory by the plurality of buffer memories.

\* \* \* \* \*